(12) United States Patent
Kang et al.

(10) Patent No.: US 11,329,014 B2
(45) Date of Patent: May 10, 2022

(54) SEMICONDUCTOR PACKAGE

(71) Applicant: SAMSUNG ELECTRONICS CO., LTD., Suwon-si (KR)

(72) Inventors: Myungsam Kang, Suwon-si (KR); Changbae Lee, Suwon-si (KR); Bongju Cho, Suwon-si (KR); Younggwan Ko, Suwon-si (KR); Yongkoon Lee, Suwon-si (KR); Moonil Kim, Suwon-si (KR); Youngchan Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 159 days.

(21) Appl. No.: 16/703,279

(22) Filed: Dec. 4, 2019

(65) Prior Publication Data
US 2020/0312797 A1 Oct. 1, 2020

(30) Foreign Application Priority Data

Mar. 27, 2019 (KR) ........................ 10-2019-0035203

(51) Int. Cl.
| | |
|---|---|
| *H01L 23/66* | (2006.01) |
| *H01L 23/31* | (2006.01) |
| *H01L 23/498* | (2006.01) |
| *H01L 23/00* | (2006.01) |
| *H01L 23/522* | (2006.01) |

(52) U.S. Cl.
CPC .......... *H01L 23/66* (2013.01); *H01L 23/3114* (2013.01); *H01L 23/49811* (2013.01); *H01L 23/49827* (2013.01); *H01L 23/5226* (2013.01); *H01L 24/05* (2013.01); *H01L 24/13* (2013.01); *H01L 2223/6677* (2013.01); *H01L 2224/0401* (2013.01)

(58) Field of Classification Search
CPC ... H01L 23/66; H01L 23/315; H01L 23/3114; H01L 24/13; H01L 2223/6677
See application file for complete search history.

(56) References Cited

U.S. PATENT DOCUMENTS

| | | | | |
|---|---|---|---|---|
| 2014/0145883 | A1* | 5/2014 | Baks | ..................... H01Q 1/2283 343/700 MS |
| 2015/0348917 | A1* | 12/2015 | Tsai | ..................... H01L 25/0657 257/774 |

(Continued)

FOREIGN PATENT DOCUMENTS

KR 10-2018-0127144 A 11/2018

*Primary Examiner* — Phat X Cao
(74) *Attorney, Agent, or Firm* — Sughrue Mion, PLLC

(57) ABSTRACT

A semiconductor package includes: a connection structure including one or more redistribution layers; a core structure disposed on a surface of the connection structure; a semiconductor chip disposed on the surface and including connection pads electrically connected to the redistribution layers of the connection structure; a first encapsulant disposed on the surface and covering at least a portion of each of the core structure and the semiconductor chip; an antenna substrate disposed on the first encapsulant and including one or more wiring layers, at least a portion of the wiring layers including an antenna pattern; and a through via penetrating at least a portion of each of the connection structure, the core structure, the first encapsulant, and the antenna substrate.

16 Claims, 12 Drawing Sheets

(56) References Cited

U.S. PATENT DOCUMENTS

2016/0240492 A1    8/2016  Wolter et al.
2018/0337148 A1*  11/2018  Baek ........................ H01L 23/66
2020/0303822 A1*  9/2020  Yao ................... H01L 23/49816

* cited by examiner

SEMICONDUCTOR PACKAGE

CROSS-REFERENCE TO RELATED APPLICATIONS

This application claims the benefit of priority to Korean Patent Application No. 10-2019-0035203 filed on Mar. 27, 2019 in the Korean Intellectual Property Office, the disclosure of which is incorporated herein by reference in its entirety.

TECHNICAL FIELD

The present disclosure relates to a semiconductor package, and more specifically, to a semiconductor package including an antenna substrate integrated therewith.

BACKGROUND

In recent years, as a number of electronic devices related to information technology (IT) increases, electronic components used therein have become increasingly complex, and such electronic devices have been implemented with increasingly high performance, enabling a high-speed data processing environment. Furthermore, since recent radio-frequency (RF) products use increasingly high frequencies and wider band width, multi bands are increasingly more in use. In view of the foregoing, a structure capable of isolating blocks is necessary in a small package or module product containing components capable of causing interference, such as an application processor (AP) chip and a RF chip.

SUMMARY

An aspect of the present disclosure may provide a semiconductor package which can be made smaller and thinner by being integrated with an antenna substrate, and enables process warpage control, while effectively blocking electromagnetic interference (EMI).

According to an aspect of the present disclosure, an antenna substrate may be disposed on and integrated with an encapsulant of a semiconductor package while providing a vertical electrical connection path using a through via penetrating portions of the semiconductor package and the antenna substrate.

For example, according to an example embodiment proposed in the present disclosure, a semiconductor package may include: a connection structure having a first surface and a second surface opposing the first surface, and including one or more redistribution layers; a core structure disposed on the first surface of the connection structure; a semiconductor chip disposed on the first surface of the connection structure, and including connection pads electrically connected to the redistribution layers of the connection structure; a first encapsulant disposed on the first surface of the connection structure and covering at least a portion of each of the core structure and the semiconductor chip; an antenna substrate disposed on the first encapsulant and including one or more wiring layers, at least a portion of the wiring layers including an antenna pattern; and a through via penetrating at least a portion of each of the connection structure, the core structure, the first encapsulant, and the antenna substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. In the accompanying drawings, shapes, sizes, and the like, of components may be exaggerated or simplified for clarity.

Electronic Device

Figure 1:
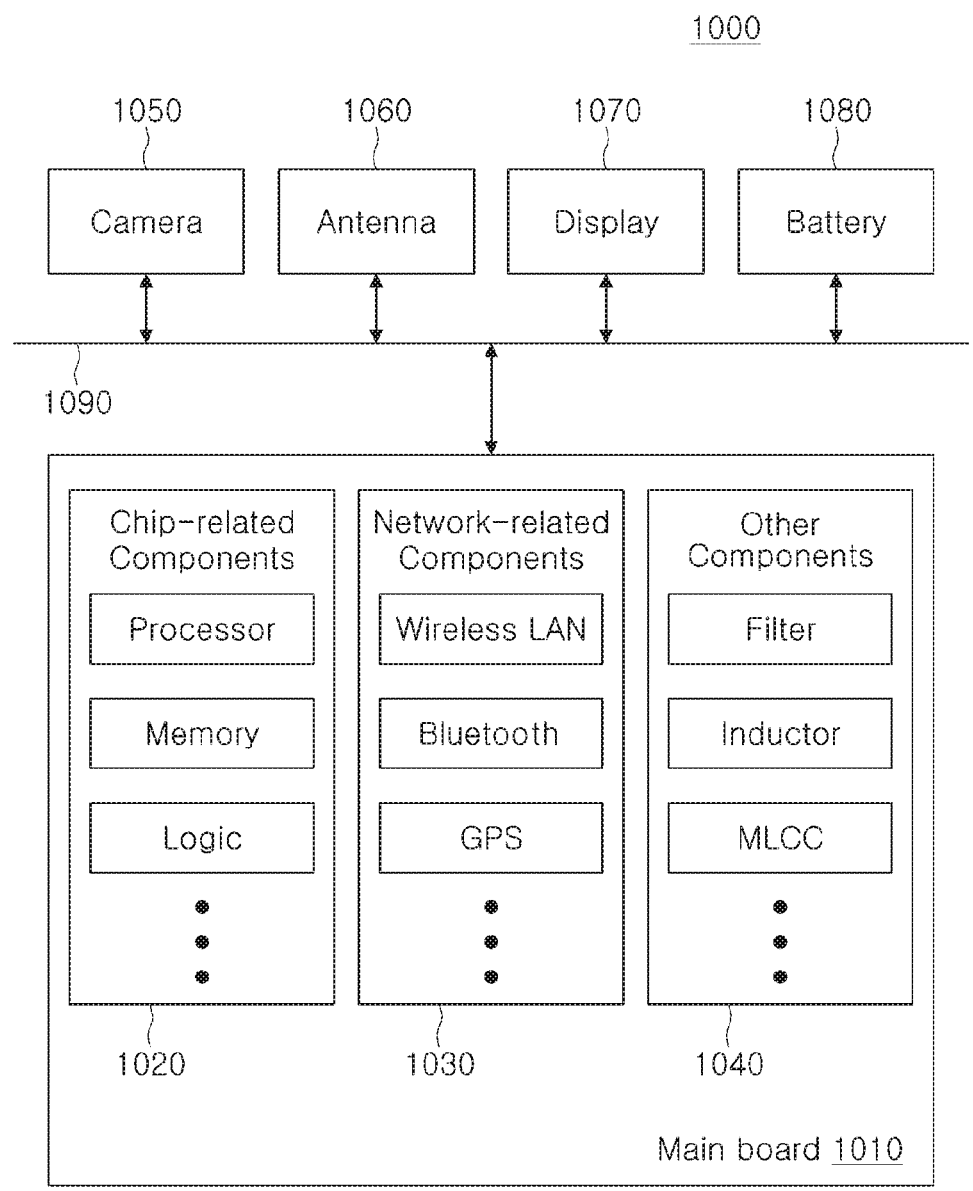
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip set related components 1020, network related components 1030, other components 1040, and the like, physically or electrically connected thereto. These components may be connected to other components, to be described below, to form various signal lines 1090.

The chip set related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip set related components 1020 are not limited thereto, and may also include other types of chip related components. In addition, the chip set related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip set related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip set related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
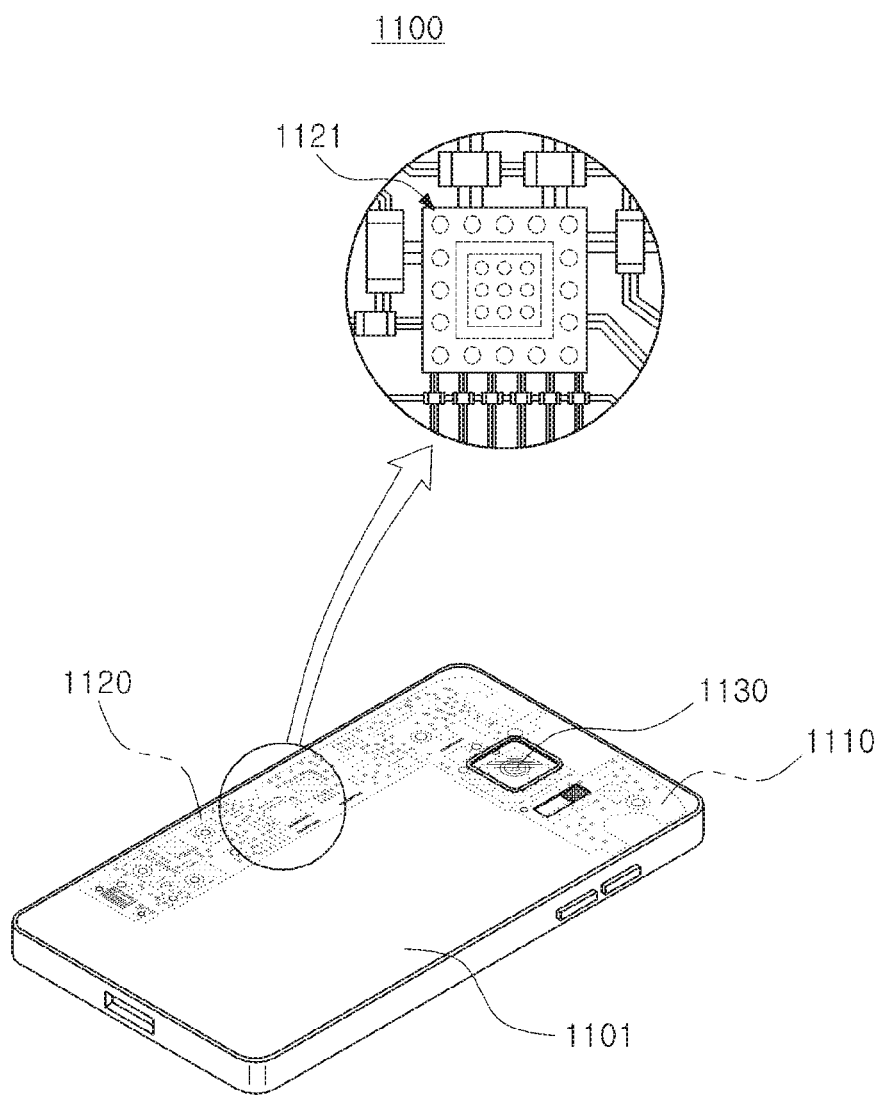
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
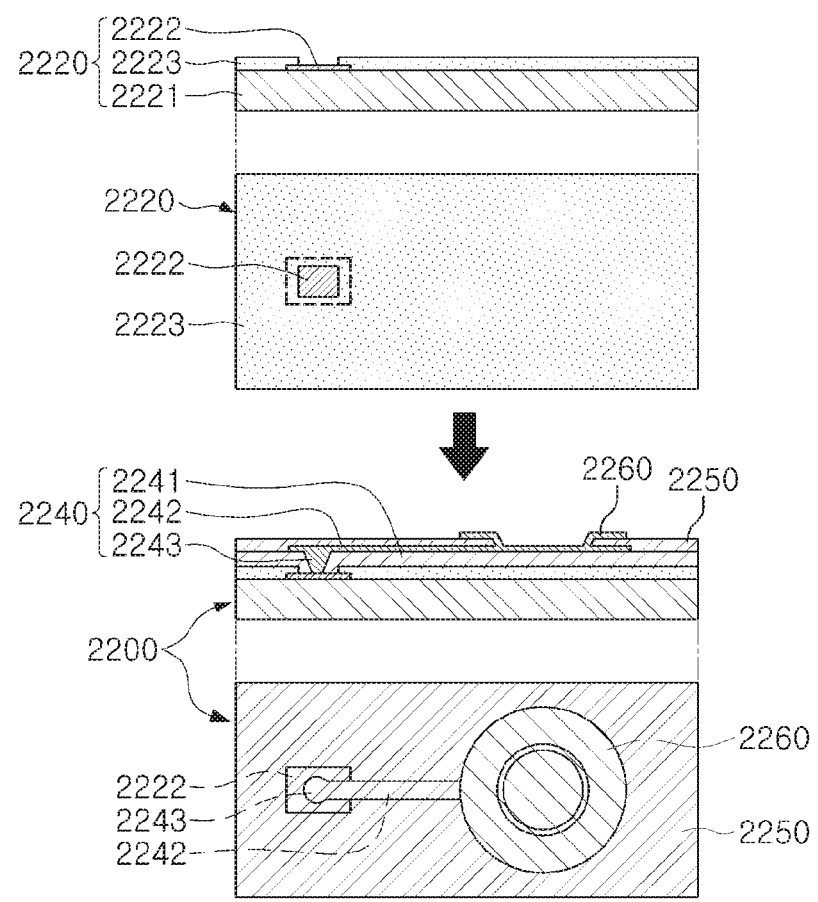
FIGS. 3A and 3B are schematic cross-sectional views illustrating a fan-in semiconductor package before and after being packaged.
Figure 3B:
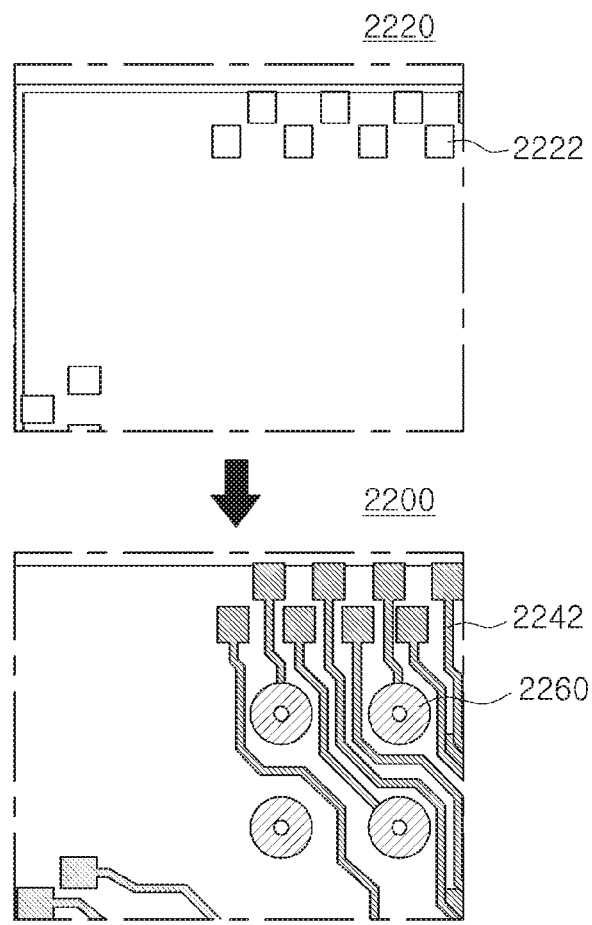
Figure 4:
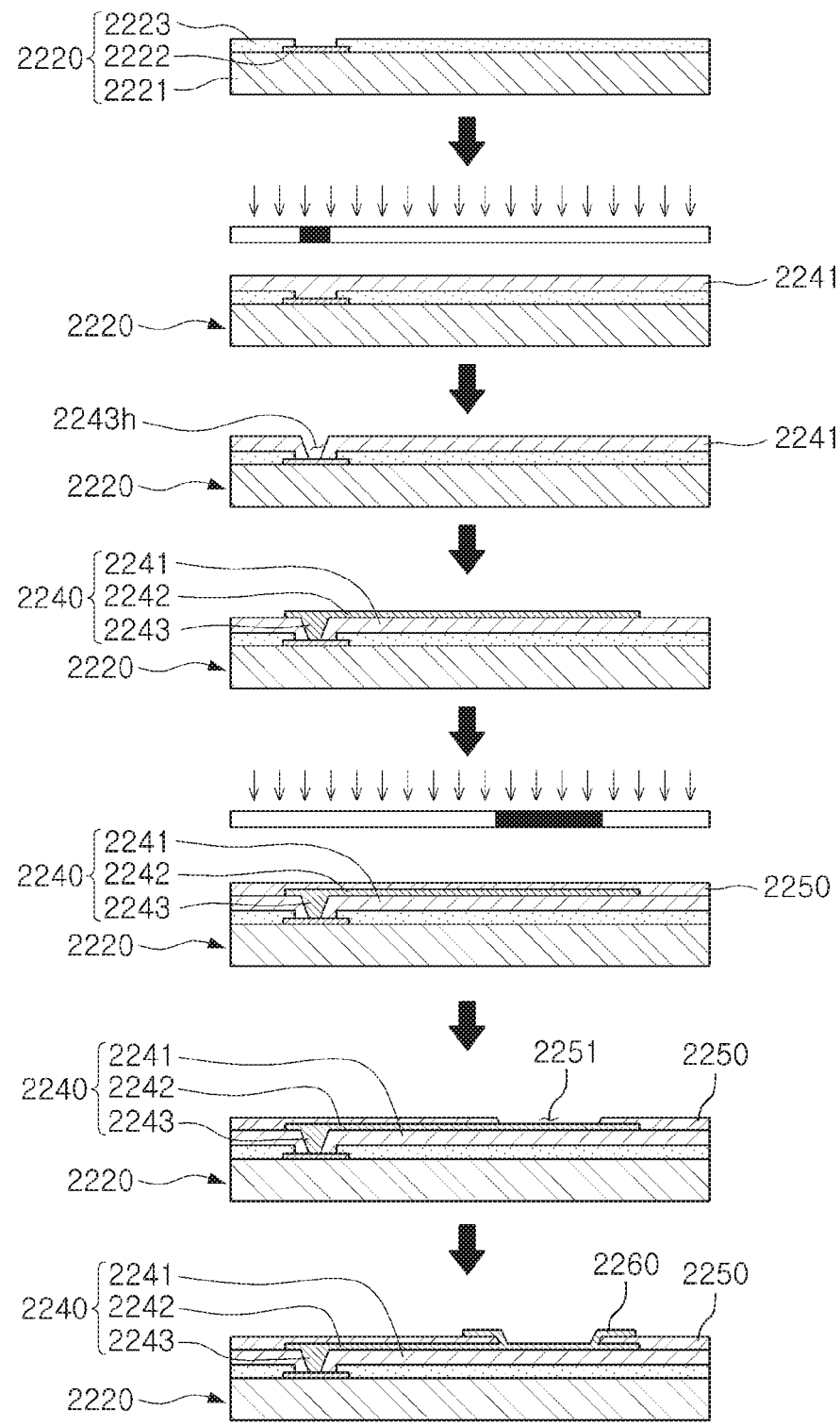
FIG. 4 shows a series of schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
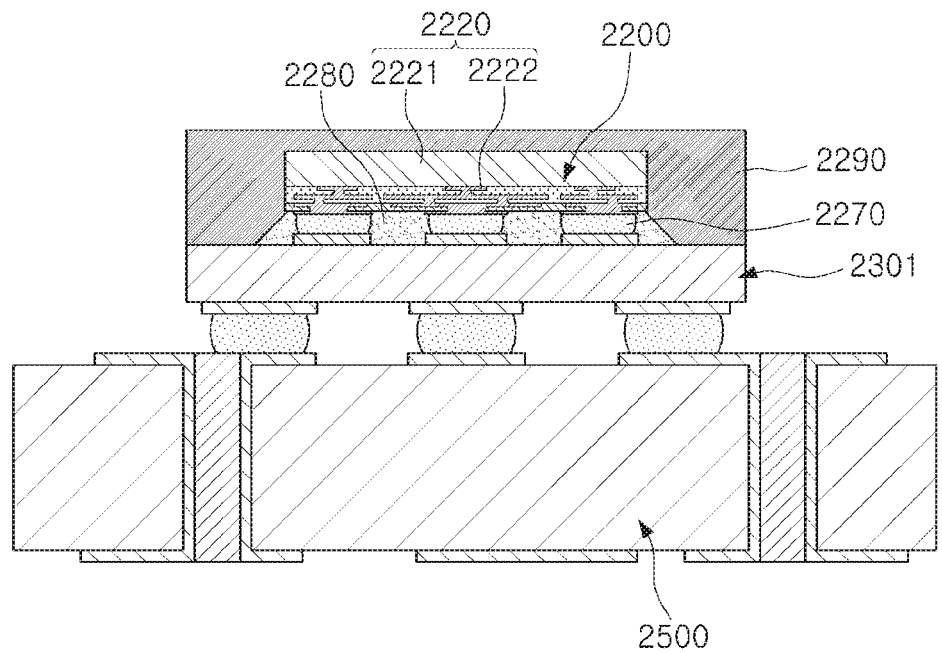
FIG. 5 is a schematic cross-sectional view illustrating a fan-in semiconductor package mounted on an interposer substrate that is ultimately mounted on a main board of an electronic device.
Figure 6:
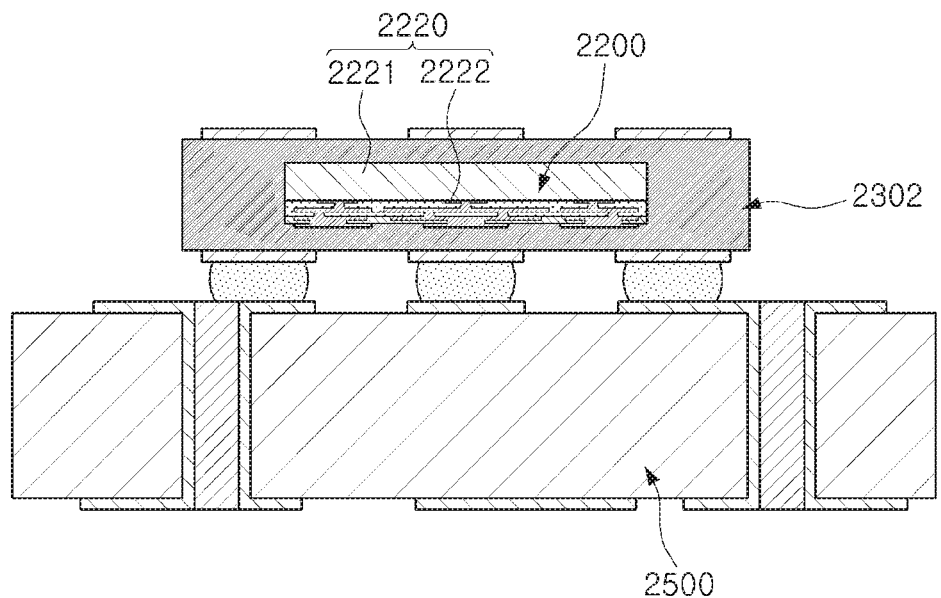
FIG. 6 is a schematic cross-sectional view illustrating a fan-in semiconductor package embedded in an interposer substrate that is ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
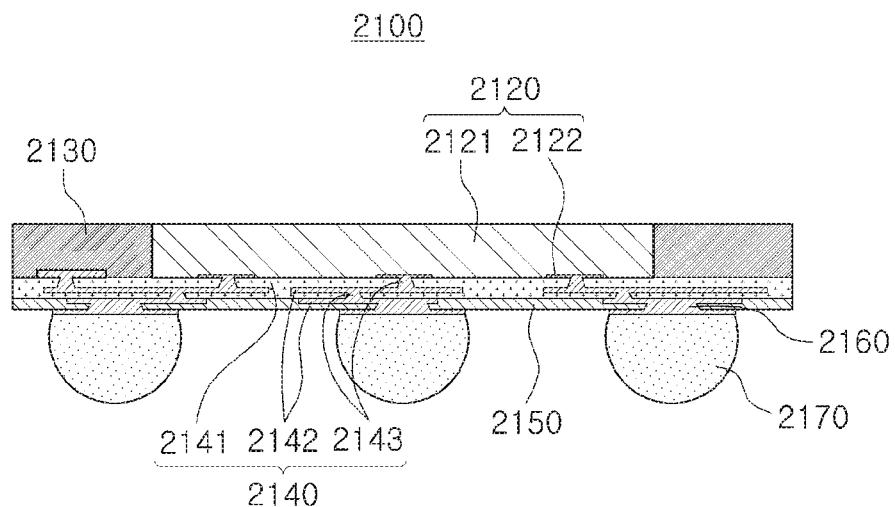
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
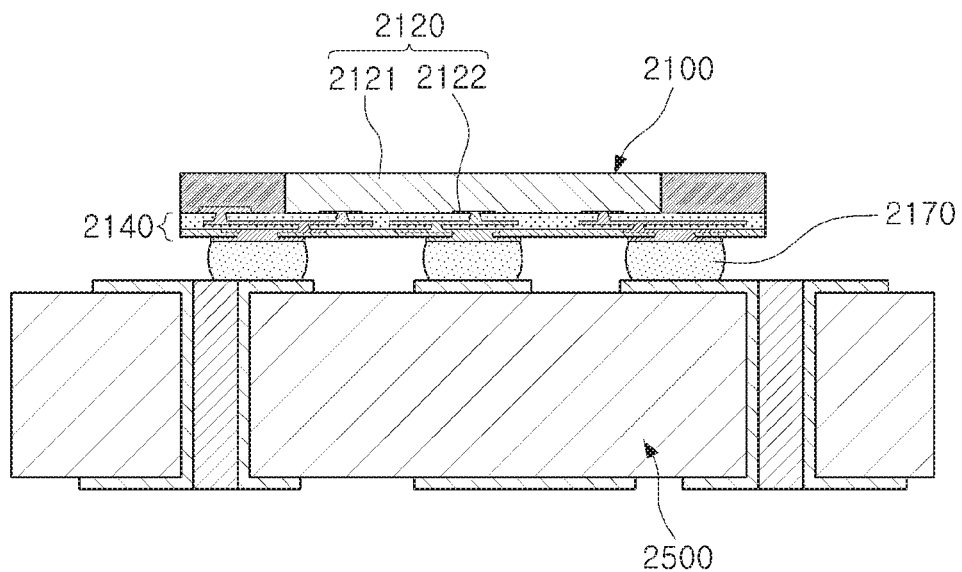
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB) and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
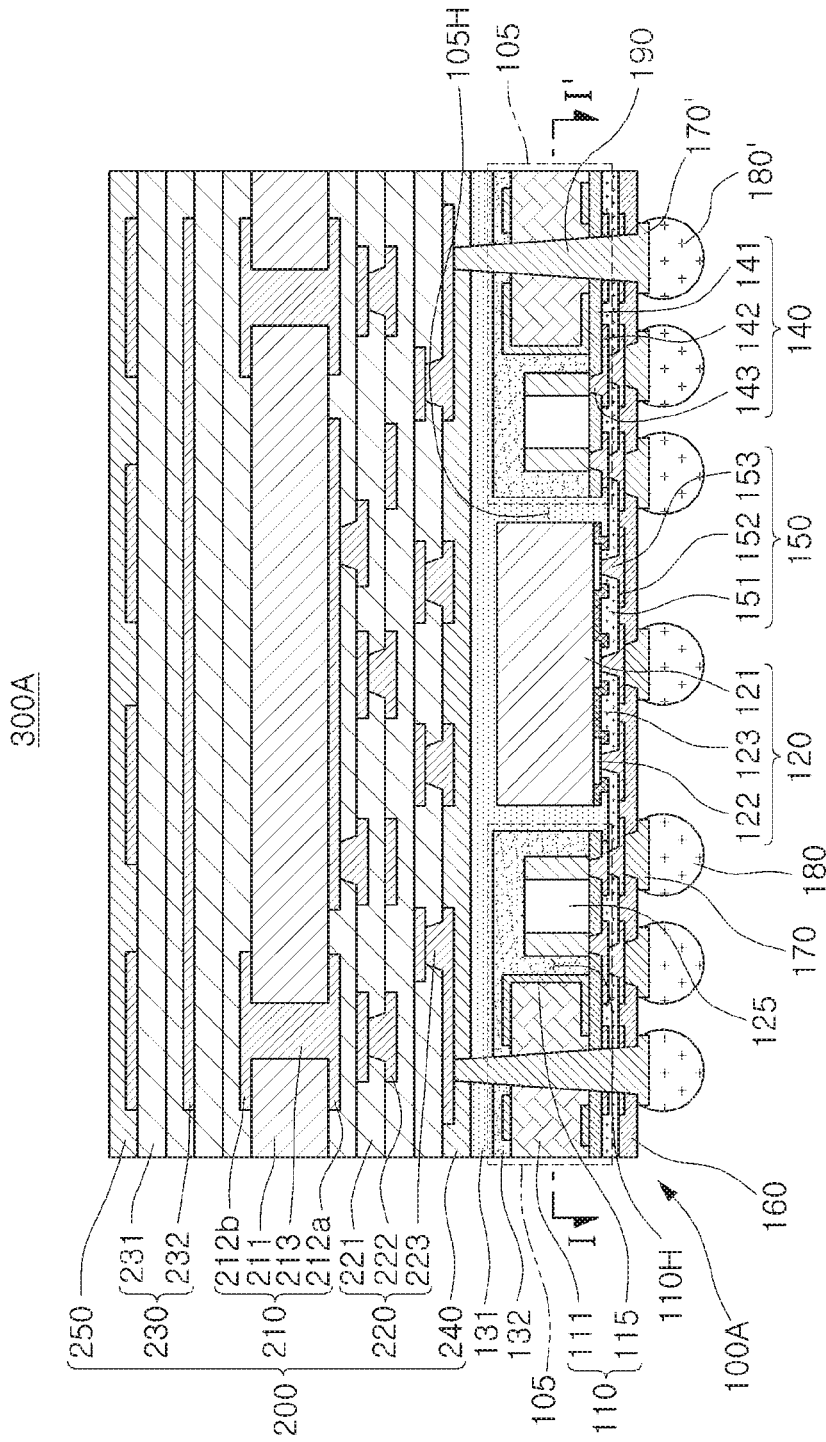
FIG. 9 is a schematic cross-sectional view illustrating a semiconductor package according an example embodiment.

FIG. 9 is a cross-sectional view schematically illustrating an example of a semiconductor package.

Figure 10:
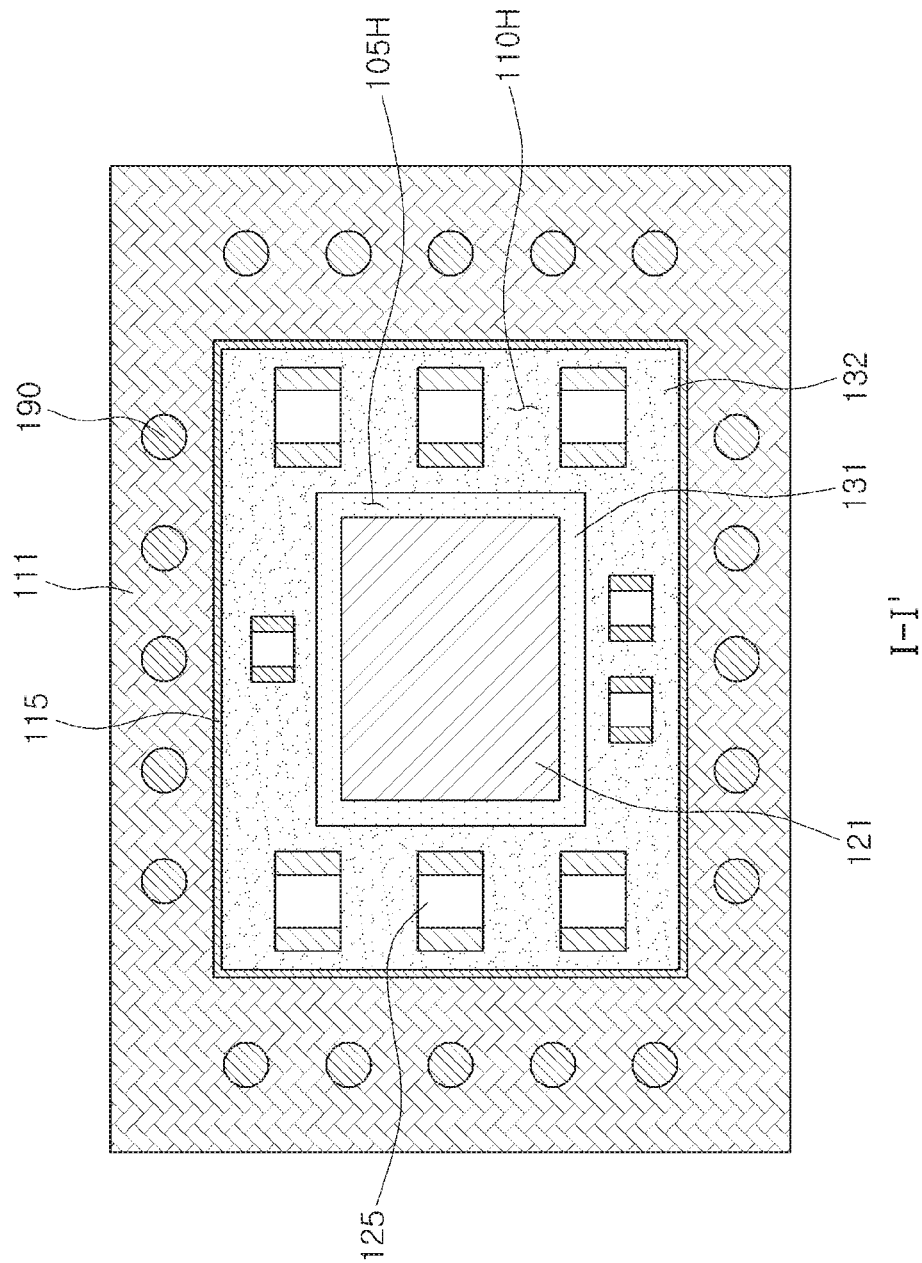
FIG. 10 is a schematic plan view of the semiconductor package of FIG. 9 taken along line I-I'.

FIG. 10 is a plan view schematically illustrating the semiconductor package of FIG. 9, taken along line I-I'.

Referring to the drawings, a semiconductor package 300A according to an example embodiment includes a package substrate 100A and an antenna substrate 200 disposed on and integrated with the package substrate 100A. The package substrate 100A includes a connection structure 150 including one or more redistribution layers 152, a core structure 105 disposed on an upper surface of the connection structure 150, a semiconductor chip 120 disposed on the upper surface of the connection structure 150 and including connection pads 122 electrically connected to the redistribution layers 152, and a first encapsulant 131 disposed on the upper surface of the connection structure 150 and covering at least portions of the core structure 105 and the semiconductor chip 120. The antenna substrate 200 is disposed on the first encapsulant 131. For example, the antenna substrate 200 may be disposed in physical contact with an upper surface of the first encapsulant 131. The package substrate 100A and the antenna substrate 200 are electrically connected to each other through a through via 190. The through via 190 may penetrate at least portions of each of the connection structure 150, the core structure 105, the first encapsulant 131, and the antenna substrate 200. Accordingly, a vertical electrical connection path may be provided.

As described above, the semiconductor package 300A according to an example embodiment includes the antenna substrate 200 disposed on the first encapsulant 131 and integrated with the package substrate 100A, and provides the vertical electrical connection path through the through via 190, and thus can be fabricated smaller and thinner in dimension. In addition, a signal pass between the package substrate 100A and the antenna substrate 200 may be minimized. In addition, wiring layers 212a, 212b, 222, and 232 of the package substrate 200 may be disposed on a backside of the semiconductor chip 120 and function as a backside metal layer for shielding electromagnetic waves, thus eliminating the need for forming an additional backside metal layer for shielding electromagnetic waves, while effectively shielding electromagnetic waves of the semiconductor chip 120. Also, as can be seen in a subsequent process, the antenna substrate 200 may be used as a carrier when forming the package substrate 100A, thereby effectively improving process warpage.

Meanwhile, in an example embodiment, the core structure 105 includes a wiring member 140 including one or more wiring layers 142 disposed on the connection structure 150 and electrically connected to a redistribution layer 152 of the connection structure 150, a frame 110 disposed on the wiring member 140, one or more passive components 125 disposed on the wiring member 140 and electrically connected to the wiring layers 142 of the wiring member 140, and a second encapsulant 132 disposed on the wiring member 140 and covering at least portions of each of the frame 110 and the passive components 125.

As described above, through two encapsulation processes using the first encapsulant 131 encapsulating the semiconductor chip 120 and the second encapsulant 132 encapsulating the passive components 125, the passive components 125 can be disposed independently and encapsulated prior to disposing the semiconductor chip 120. Accordingly, even when defects occur in mounting the passive components 125, or foreign materials are introduced in a mounting process, there is no need to discard the semiconductor chip 120. That is, issues related to yield of the semiconductor chip 120 arising when encapsulating the passive components 125 along with the semiconductor chip 120 in a single encapsulant, the issues due to mounting defects of the passive components 125 and defects caused by foreign materials, can be effectively reduced.

Also, in a case in which an additional wiring member 140 for placing the passive components 125 is included, the material of an insulating layer 141 of the wiring member 140 may be selected independently of the semiconductor chip 120, and for example, the material may not be a photosensitive insulating material, such as photo imageable dielectric (PID) material, but a non-photosensitive insulating material such as Ajinomoto Build-up Film (ABF) or the like. Since such film-type non-photosensitive insulating material has excellent planarity, issues related to undulation or formation of cracks may be effectively prevented. Also, since an opening in the non-photosensitive insulating material is formed using a laser via, even when the material of the second encapsulant 132 bleeds into electrodes of the passive components 125, the electrodes may be effectively opened using the laser via. Accordingly, issues related to defective electrode opening may be addressed. Furthermore, independent of the foregoing, a photosensitive insulating material may be used for an insulating layer 151 of the connection structure 150, fine pitches may be introduced through photo vias, and connection pads 122 of the semiconductor chip 120 may be effectively redistributed.

Meanwhile, as an example, the semiconductor chip 120 is disposed in a face-down manner such that a surface of the semiconductor chip 120 on which the connection pads 122 are disposed faces an upper surface of the connection structure 150. Here, in an example embodiment, the core structure 105 includes the wiring member 140, a surface of the semiconductor chip 120 in contact with the connection structure 150 may have a step with respect to a surface of the passive component 125 in contact with the wiring member 140. In addition, the core structure 105 may have a first through portion 105H in which the semiconductor chip 120 is disposed and which is partially filled with the first encapsulant 131, and the frame 110 may have a second through portion 110H in which the passive component 125 is disposed and which is partially filled with the second encapsulant 132. Similarly to the step described above, the first through portion 105H may have a greater depth than that of the second through portion 110H. As a non-limiting example, the first through portion 105H may be disposed in a region within the second through portion 110H when viewed in plane. Accordingly, the semiconductor package 300A may be designed to be more compact in size and thus may be fabricated smaller and thinner in dimension.

Meanwhile, as an example, a first metal layer 115 may be disposed on an inner wall surface of the second through portion 110H of the frame 110, to thereby shield electromagnetic waves in a side surface direction of the semiconductor chip 120. The first metal layer 115 may be disposed on the entire inner wall surface of the second through portion 110H, and if necessary, may extend onto an upper surface and a lower surface of the frame 110. More specifically, the first metal layer 115 may extend onto an upper surface and a lower surface of an insulating layer 111 of the frame 110.

Meanwhile, as an example, if necessary, the semiconductor substrate 100A may further include a passivation layer 160 disposed on a lower surface of the connection structure 150 and including an opening exposing at least portions of the redistribution layer 152, a first under bump metal 170 disposed in the opening of the passivation layer 160 and on a lower surface of the passivation layer 160 and electrically connected to the redistribution layer 152, and a first electrical connection metal 180 disposed on the lower surface of the passivation layer 160 and electrically connected to the redistribution layer 152 exposed through the first under bump metal 170. Also, the semiconductor substrate 100A may further include a second under bump metal 170' disposed on the lower surface of the passivation layer 160, and a second electrical connection metal 180' disposed on the lower surface of the passivation layer 160 and electrically connected to the second under bump metal 170'. The through via 190 may penetrate the passivation layer 160, and as a result, a lowermost wiring layer 222 of the antenna substrate 200 and the second under bump metal 170' may be electrically connected through the through via 190.

Meanwhile, in an example embodiment, if necessary, the through via 190 may penetrate at least portions of the wiring layer 142 of the wiring member 140 and/or at least portions of the redistribution layer 152 of the connection structure 150. In addition, the penetrated wiring layer 142 of the wiring member 140 and/or redistribution layer 152 of the connection structure 150 may be in physical contact with the through via 190 in penetrated portions, thereby being electrically connected. That is, through the through via 190, a lowermost wiring layer 222 of the antenna substrate 200 may be electrically connected to the wiring layer 142 and/or the redistribution layer 152.

Hereinbelow, referring to the accompanying drawings, each of components of the semiconductor package 300A according to an example embodiment will be described in greater detail.

The core structure 105 is a configuration enabling the passive component 125 to be placed prior to placing the semiconductor chip 120. The core structure 105 includes the wiring member 140, the frame 110, one or more passive components 125, and the second encapsulant 132. The core structure 105 includes the first through portion 105H penetrating the wiring member 140 and the second encapsulant 132. The first through portion 105H may be in the form of a through groove having continuously connected side walls.

The frame 110 may further enhance rigidity of the package 300A, depending on the particular material of the insulating layer 111, and may serve to ensure a uniform thickness of the second encapsulant 132. The frame 110 includes the second through portion 110H penetrating the insulating layer 111. The passive component 125 is disposed in the second through portion 110H. When viewed in a plane, the first through portion 105H is disposed in a region within the second through portion 110H, and accordingly, the semiconductor chip 120 is also disposed in the second through portion 110H in an example embodiment. The second through portion 110H may be in the form of a through groove having continuously connected side walls. In addition to the insulating layer 111, the frame 110 may further include the first metal layer 115 disposed on an inner wall surface of the second through portion 110H, and the first metal layer 115 may extend onto an upper surface and/or a lower surface of the insulating layer 111. If necessary, in addition to the first metal layer 115, a wiring layer (not illustrated) may be further disposed on the upper surface and/or the lower surface of the insulating layer 111, and the wiring layer (not illustrated) may be in physical connection with the through via 190, thereby being electrically connected to components on another level.

The material of the insulating layer 111 is not particularly limited. For example, an insulating material may be used for the material of the insulating layer 111, and examples of the insulating material are a thermosetting resin such as an epoxy resin, a thermoplastic resin such as polyimide, or a resin in which the thermosetting resin or the thermoplastic resin is mixed with inorganic filler, such as ABF. Also, a material such as prepreg, the material having the thermosetting resin or the thermoplastic resin impregnated with inorganic filler in a core material such as glass fiber, glass cloth, and glass fabric, may be used.

The first metal layer 115 contains a metal material and may be disposed on an inner wall surface of the second through portion 110H, and an electromagnetic shielding effect as well as heat dissipation effect may be provided by virtue of the first metal layer 115. The first metal layer 115 may be formed using a metal material such as copper (Cu), aluminum (Al), silver (Ag), tin (Sn), gold (Au), nickel (Ni), lead (Pb), titanium (Ti), and alloys thereof. The first metal layer 115 may be formed through a plating process known in the art and may include a seed layer and a plated layer. The first metal layer 115 may be used as a ground plane if necessary, and in this case, may be electrically connected to a ground pattern of the wiring layer 142 and/or a ground pattern of the redistribution layer 152 through the through via 190.

Each of the passive components 125 may be a component in the form of a chip. Here, the component in the form of a chip refers to a component in the form of a separate chip, including an internal electrode inside a body, and outside the body, an external electrode electrically connected to the internal electrode. The passive component 125 may be a passive component known in the art, such as a capacitor, an inductor, beads, and the like. For example, each of the passive components 125 may be a capacitor such as a multilayer ceramic capacitor (MLCC), a low inductance chip capacitor (LICC), and the like, or an inductor such as a power inductor and the like, and is not limited thereto.

The wiring member 140 may redistribute electrodes of each of the passive components 125. The wiring member 140 includes the insulating layer 141, the wiring layer 142 disposed on a lower surface of the insulating layer 141, and a wiring via 143 penetrating the insulating layer 141 and connected to the wiring layer 142. The number of the insulating layer 141, the wiring layer 142, and the wiring via 143 may be more or less than those illustrated in the drawings. That is, the number of the layers may vary according to the specification of a design.

The insulating layer 141 may be formed using an insulating material, and examples of the insulating material may be a non-photosensitive insulating material containing an inorganic filler such as silica and alumina, for example, ABF. In this case, defects due to undulation and crack formation may be effectively addressed. Also, defective opening issues of electrodes of the passive components 125 due to bleeding of the material of the second encapsulant 132 may be effectively addressed.

The wiring layer 142 may redistribute the electrodes of the passive components 125, thereby electrically connecting the electrodes of the passive components 125 to the connection pads 122 of the semiconductor chip 120. That is, the wiring layer 142 may function as a redistribution layer RDL. The wiring layer 142 may be formed using a metal material such as copper (Cu), aluminum (Al), silver (Ag), tin (Sn), gold (Au), nickel (Ni), lead (Pb), titanium (Ti), or an alloy thereof. The wiring layer 142 may serve various functions according to the specification of a design. For example, the wiring layer 142 may include a ground (GrouND: GND) pattern, a power (PoWeR: PWR) pattern, a signal (Signal: S) pattern, and the like. Here, the S pattern includes various signals, except for the GND pattern and the PWR pattern, such as data signals and the like. The GND pattern and the PWD pattern may be an identical pattern. Also, the wiring layer 142 may include via pads of various kinds. Since the first through portion 105H in which the semiconductor chip 120 is disposed penetrates the insulating layer 141 as well, a lower surface of the insulating layer 142 may be substantially on the same level as a lower surface of the semiconductor chip 120. That is, the lower surface of the wiring layer 142 may be coplanar with the lower surface of the semiconductor chip 120.

The wiring vias 143 electrically connect the passive components 125 and the wiring layer 142 to each other. The wiring vias 143 may be in physical contact with the electrodes of the passive components 125, respectively. That is, the passive components 125 may be in direct contact with the wiring vias 143 in an embedded fashion, not in a surface mounted fashion using solder bumps and the like. The wiring vias 143 may be formed using a metal material such as copper (Cu), aluminum (Al), silver (Ag), tin (Sn), gold (Au), nickel (Ni), lead (Pb), titanium (Ti), or an alloy thereof. The wiring vias 143 may include a signal via, a power via, a ground via, or the like, and the power via and the ground via may be an identical via. Each of the wiring vias 143 may be a filled type via filled with a metal material, or a conformal type via in which a metal material is formed along an inner wall of a via hole. The wiring vias 143 may be formed by a plating process and may include a seed layer and a conductive layer.

The second encapsulant 132 covers at least portions of the frame 110 and the passive components 125. Also, the second encapsulant 132 fills at least portions of the second through portion 110H. The second encapsulant 132 contains an insulating material. Examples of the insulating material include materials containing an inorganic filler and an insulating resin, for example, a thermosetting resin such as an epoxy resin, a thermoplastic resin such as polyimide, and a resin in which the thermosetting resin or the thermoplastic resin is mixed with a reinforcing material such as an inorganic filler, such as ABF, FR-4, and BT resin. Also, the second encapsulant 132 may be formed using a molding material such as an epoxy molding compound (EMC) or using a photosensitive material such as a photo imageable encapsulant (PIE) as needed. If necessary, a prepreg may be also used.

The semiconductor chip 120 may be an integrated circuit (IC) in a bare state, in which several hundreds to several millions of components are integrated in a single chip. For example, the IC of the semiconductor chip 120 may be a radio-frequency IC (RFIC). If necessary, the semiconductor chip 120 may include a plurality of semiconductor chips, and may further include a power management IC (PMIC). When a plurality of semiconductor chips 120 are included, the semiconductor chips 120 may be disposed in different blocks from one other, such that electromagnetic waves are shielded from each other. Meanwhile, the semiconductor chip 120 is not limited to the aforementioned types, and may be an application processor (AP) or the like.

The semiconductor chip 120 may include a body 121 in which various circuits are formed, and connection pads 122 may be formed on an active surface of the body portion 121. The body portion 121, for example, may be formed based on an active wafer, and in this case, silicon (Si), germanium (Ge), gallium arsenic (GaAs), or the like may be used as the base material for forming the body portion 121. The connection pads 122 are for electrically connecting the semiconductor chip 120 to other components, and may be formed of a metal material, such as aluminum (Al) and copper (Cu). On an active surface of the semiconductor chip 120, a passivation layer 123 may be disposed which includes an oxide film and/or a nitride film including openings exposing at least portions of the connection pads 122. In addition, an insulating layer (not illustrated) may be further disposed in other desired areas. The semiconductor chip 120 may be a bare die, and in this case, the connection pads 122 may be in physical contact with a connection via 153. However, the semiconductor chip 120, if necessary, may be a packaged die in which a redistribution layer (not illustrated), metal bumps (not illustrated), and the like are additionally formed on an active surface thereof.

The first encapsulant 131 covers at least portions of each of the core structure 105 and the semiconductor chip 120, and fills at least portions of the first through portion 105H. The first encapsulant 131 may include an insulating material, and examples of the insulating material include non-photosensitive insulating materials. More particularly, examples of the insulating material include a non-photosensitive insulating material containing an inorganic filler and an insulating resin, such as thermosetting resin such as epoxy resin, thermoplastic resin such as polyimide, or resin in which the thermosetting resin or the thermoplastic resin is mixed with a reinforcing material such as an inorganic filler, for example, non-photosensitive insulating materials such as ABF and EMC. If necessary, materials in which an insulating resin such as a thermosetting resin or a thermoplastic resin is impregnated in an inorganic filler and/or a core material such as glass fiber and the like, for example, prepreg may be used. Accordingly, issues associated with voids and undulation can be addressed and warpage can be more easily controlled. If necessary, PIE may be used for the first encapsulant 131.

The first and second encapsulants 131 and 132 may contain the same material or different materials from each other. Even when the first and second encapsulants 131 and 132 contain the same material, their boundaries may be readily apparent. However, in some cases, the first and second encapsulants 131 and 132 may be integrated with each other such that boundaries between the first and second encapsulants 131 and 132 are not readily apparent. The first and second encapsulants 131 and 132 may contain materials similar to each other but may be different from each other in terms of color. If necessary, the second encapsulant 132 may be realized using an insulating material, while the first encapsulant 131 may be realized using a magnetic material. In this case, the first encapsulant 131 may have an electromagnetic waves-absorbing effect. Since electrodes are not exposed through the body portion 121 of the semiconductor chip 120, there may be no particular problem arising even when the first encapsulant 131 is formed of a magnetic material.

The connection structure 150 may redistribute the connection pads 122 of the semiconductor chip 120. Connection pads 122 of several tens to several hundreds of semiconductor chips 120 having various functions may be redistributed by the connection structure 150, and through electrical connection metals 180, may be physically and/or electrically connected to an external component in accordance with functions thereof. The connection structure 150 includes the insulating layer 151, the redistribution layer 152 disposed on a lower surface of the insulating layer 151, and the connection via 153 penetrating the insulating layer 151 and connected to the redistribution layer 152. The number of the insulating layer 151, the redistribution layer 152, and the connection via 153 may be more or less than those illustrated in the drawings. In other words, the number of the layers may vary depending on the specification of a design.

The insulating layer 151 may be formed using an insulating material. As the insulating material, PID may be used, and in this case, fine pitches can be achieved using photo vias, and thus using PID is advantageous for designing a micropattern and high-density circuit, redistributing several tens to several millions of the connection pads 122 of the semiconductor chip 120 extremely effectively. Boundaries between the insulating layers 151 may be apparent or may be not readily apparent.

The redistribution layer 152 may redistribute the connection pads 122 of the semiconductor chip 120, thereby electrically connecting the connection pads 122 to the electrical connection metals 180. The redistribution layer 152 may be formed using a metal material such as copper (Cu), aluminum (Al), silver (Ag), tin (Sn), gold (Au), nickel (Ni), lead (Pb), titanium (Ti), or an alloy thereof. The redistribution layer 152 may serve various functions according to the specification of a design. For example, the redistribution layer 152 may include a GND pattern, a PWR pattern, an S pattern, and the like. The GND pattern and the PWR pattern may be an identical pattern. Also, the redistribution layer 152 may include pads of various kinds, such as via pads, electrical connection pads, and the like. The redistribution layer 152 may be also formed by a plating process, and may include a seed layer and a conductive layer.

The connection vias 153 electrically connects the redistribution layer 152 to the connection pads 122 of the semiconductor chip 120, and to the wiring layer 142 of the wiring member 140, respectively. When there are provided a plurality of redistribution layers 152, the connection vias 153 electrically connect the redistribution layers 152 formed on different layers to each other. The connection vias 153 may be formed using a metal material such as copper (Cu), aluminum (Al), silver (Ag), tin (Sn), gold (Au), nickel (Ni), lead (Pb), titanium (Ti), or an alloy thereof. The connection vias 153 may include a signal via, a power via, a ground via, and the like, and the power via and the ground via may be an identical via. Each of the connection vias 153 may be a filled-type via filled with a metal material, or a conformal-type via in which a metal material is formed along an inner wall of a via hole. Each of the connection vias 153 may be formed by a plating process, and may include a seed layer and a conductive layer.

The passivation layer 160 is an additional component for protecting the connection structure 150 from external physical or chemical damage or the like. The passivation layer 160 may include a thermosetting resin. For example, the passivation layer 160 may be ABF but is not limited thereto. The passivation layer 160 has openings exposing at least portions of the redistribution layer 152. There may be several tens to several tens of thousands of openings, or there may be more or less than the above range. Each opening may include a plurality of holes. If necessary, a surface mount component, such as a capacitor, may be mounted on a lower surface of the passivation layer 160 and electrically connected to the redistribution layer 152, thus being consequently electrically connected to the semiconductor chip 120.

The under bump metals 170 and 170' are also additional components for improving connection reliability of the electrical connection metals 180 and 180', thus improving board-level reliability of the semiconductor package 300A. The number of the under bump metals 170 and 170' may be from several tens to several millions, or more or less than the above range. The first under bump metals 170 may be disposed in the openings of the passivation layer 160 and on a lower surface of the passivation layer 160, and may be electrically connected to the exposed redistribution layer 152. The second under bump metals 170' may be disposed on the lower surface of the passivation layer 160 and connected to the through via 190. The under bump metals 170 and 170' may be formed by a metallization method known in the art using metal, but are not limited thereto.

The electrical connection metals 180 and 180' are also additional components for physically and/or electrically connecting the semiconductor package 300A to an external component. For example, the semiconductor package 300A may be mounted on a mainboard of an electronic device through the electrical connection metals 180 and 180'. The electrical connection metals 180 and 180' may be disposed on a lower surface of the passivation layer 160 and electrically connected to the under bump metals 170 and 170'. The electrical connection metals 180 and 180' may be formed using a low melting-point metal, such as tin (Sn) or an alloy containing tin (Sn). More specifically, the electrical connection metals 180 and 180' may be formed using solders, for example, but are not limited thereto.

Each of the electrical connection metals 180 and 180' may be a land, a ball, a pin, or the like. Each of the electrical connection metals 180 and 180' may be formed in multiple layers or a single layer. Each of the electrical connection metals 180 and 180', when formed in multiple layers, may include a copper pillar and a solder, but is not limited thereto. Alternatively, each of the electrical connection metals 180 and 180', when formed in a single layer, may include tin-silver solder or copper, but is not limited thereto. The number, interval, arrangement, or the like, of the electrical connection metals 180 and 180' are not particularly limited and can be variously modified by a person skilled in the art according to the specification of a design of a corresponding layer.

At least one of the electrical connection metals 180 and 180' is disposed in a fan-out region. The fan-out region refers to a region outside the region in which the semiconductor chip 120 is disposed. Compared to the fan-in package, the fan-out package has superior reliability, can implement a plurality of I/O terminals, and can conveniently implement 3D interconnection. Also, compared to packages such as a ball grid array (BGA) package and a land grid array (LGA) package, the fan-out package can be fabricated with a smaller thickness and can have a more competitive price.

The through via 190 is a component for electrically connecting the package substrate 100A and the antenna substrate 200 to each other. The through via 190 penetrates the package substrate 100A and penetrates at least portions of the antenna substrate 200. For example, the through via 190 may penetrate the core structure 105 of the package substrate 100A, the first encapsulant 131, the connection structure 150, the passivation layer 160, and may penetrate a first cover layer 240 of the antenna substrate 200. The through via 190 may include a metal material such as copper (Cu), aluminum (Al), silver (Ag), tin (Sn), gold (Au), nickel (Ni), lead (Pb), titanium (Ti), and an alloy thereof. Since the through via 190 can be formed together with the second under bump metals 170' by a plating process, the through via 190 and the second under bump metals 170' may be integrated with each other without apparent boundaries. The through via 190 may have a tapering shape in which an upper width is greater than a lower width. The through via 190, by penetrating at least portions of the wiring layer 142 of the wiring member 140 and/or at least portions of the redistribution layer 152 of the connection structure 150, may make physical contact with and thereby be electrically connected to the at least portions of the wiring layer 142 and/or the at least portions of the connection structure 150.

The antenna substrate 200 is a region in which mmWave/5G antenna can be implemented. The antenna substrate 200 includes a core portion 210, a first build-up portion 220 disposed below the core portion 210, a second build-up portion 230 disposed above the core portion 210, a first cover layer 240 disposed below the first build-up portion 220, and a second cover layer 250 disposed above the second build-up portion 230. The core portion 210 includes a core layer 211, first and second wiring layers 212a and 212b disposed on a lower surface and an upper surface of the core layer 211, respectively, and a first wiring via 213 penetrating the core layer 211 and electrically connecting the first and second wiring layers 212a and 212b to each other. The first build-up portion 220 includes a plurality of first build-up insulating layers 221 disposed on the lower surface of the core layer 211, a plurality of third wiring layers 222 disposed on lower surfaces of the plurality of the first build-up insulating layers 221, and a second wiring via 223 penetrating each of the plurality of the first build-up insulating layers 221, electrically connecting the plurality of third wiring layers 222 disposed on different layers to each other, and electrically connecting the first and third wiring layers 212a and 222 disposed on different layers to each other. The second build-up portion 230 includes a plurality of second build-up insulating layers 231 disposed on the upper surface of the core layer 211, and a plurality of fourth wiring layers 232 disposed on lower surfaces of the plurality of second build-up insulating layers 231. If necessary, the second build-up portion 230 may also include a wiring via (not illustrated).

The core layer 211 may be formed using an insulating material. Examples of the insulating material include thermosetting resin such as epoxy resin, thermoplastic resin such as polyimide, and materials in which the thermosetting resin or the thermoplastic resin is mixed with glass fiber and/or inorganic filler, for example, prepreg. The material of the core layer 211 is not limited to resin material, and may be a glass plate or a ceramic plate, for example. The build-up insulating layers 221 and 231 also may be formed using an insulating material. For example, the build-up insulating layers 221 and 231 may be formed using thermosetting resin such as epoxy resin, thermoplastic resin such as polyimide, or resin in which the thermosetting resin or the thermoplastic resin is mixed with inorganic filler, for example, ABF and the like. However, if necessary, the build-up insulating layers 221 and 231 may be formed using a prepreg or the like. A thickness of the core layer 211 may be greater than a thickness of each of the build-up insulating layers 221 and 231.

The wiring layers 212a, 212b, 222, and 232 may be formed using a metal material such as copper (Cu), aluminum (Al), silver (Ag), tin (Sn), gold (Au), nickel (Ni), lead (Pb), titanium (Ti), or an alloy thereof. An uppermost fourth wiring layer 232 among the plurality of fourth wiring layers 232 may include a first antenna pattern. The first antenna pattern may be an antenna pattern for spinning. If necessary, another fourth wiring layer 232 on a different level, among the plurality of fourth wiring layers 232, may also include a first antenna pattern. In this case, the first antenna patterns may be disposed overlapping each other on a plane and may be coupled to each other. For example, the first antenna patterns may form capacitance. The second wiring pattern 212b may include a second antenna pattern disposed on a lower level than the first antenna patterns. The second antenna pattern may be an antenna pattern electrically connected to an RFIC through a feeding pattern. At least one of the first wiring layer 212a and the plurality of third wiring layers 222 may include a feeding pattern electrically connected to the first antenna pattern. At least one of the plurality of fourth wiring layers 232, the first and second wiring layers 212a and 212b, and the plurality of third wiring layers 222 may include a ground pattern. In addition, the plurality of fourth wiring layers 232, the first and second wiring layers 212a and 212b, and the plurality of third wiring layers 222 may further include a signal pattern, a power pattern, a resistance pattern, or the like.

The wiring vias 213 and 223 may be formed using a metal material such as copper (Cu), aluminum (Al), silver (Ag), tin (Sn), gold (Au), nickel (Ni), lead (Pb), titanium (Ti), and alloys thereof. The wiring vias 213 and 223 may include a feeding via which electrically connects the second antenna pattern and a feeding pattern to each other, or electrically connects feeding patterns disposed on different layers to each other. Also, the wiring vias 213 and 223 may include a ground via which electrically connects ground patterns disposed on different layers to each other. In addition, the wiring vias 213 and 223 may include a signal via, a power via, or the like. The first wiring via 213 may have a cylindrical shape or a shape similar to an hourglass, and the second wiring via 223 may have a tapering shape in which an upper width is smaller than a lower width.

The cover layers 240 and 250 may protect the wiring layers 222 and 232 of the build-up portions 220 and 230. The cover layers 240 and 250 may be formed using an insulating material, and for this insulating material, thermosetting resin such as epoxy resin, thermoplastic resin such as polyimide, or resins in which the thermosetting resin or the thermoplastic resin is mixed with inorganic filler, such as ABF, EMC, and the like. However, the cover layers 240 and 250 are not limited thereto, and may be formed using a photosensitive insulating material, such as solder resist (SR).

Figure 11:
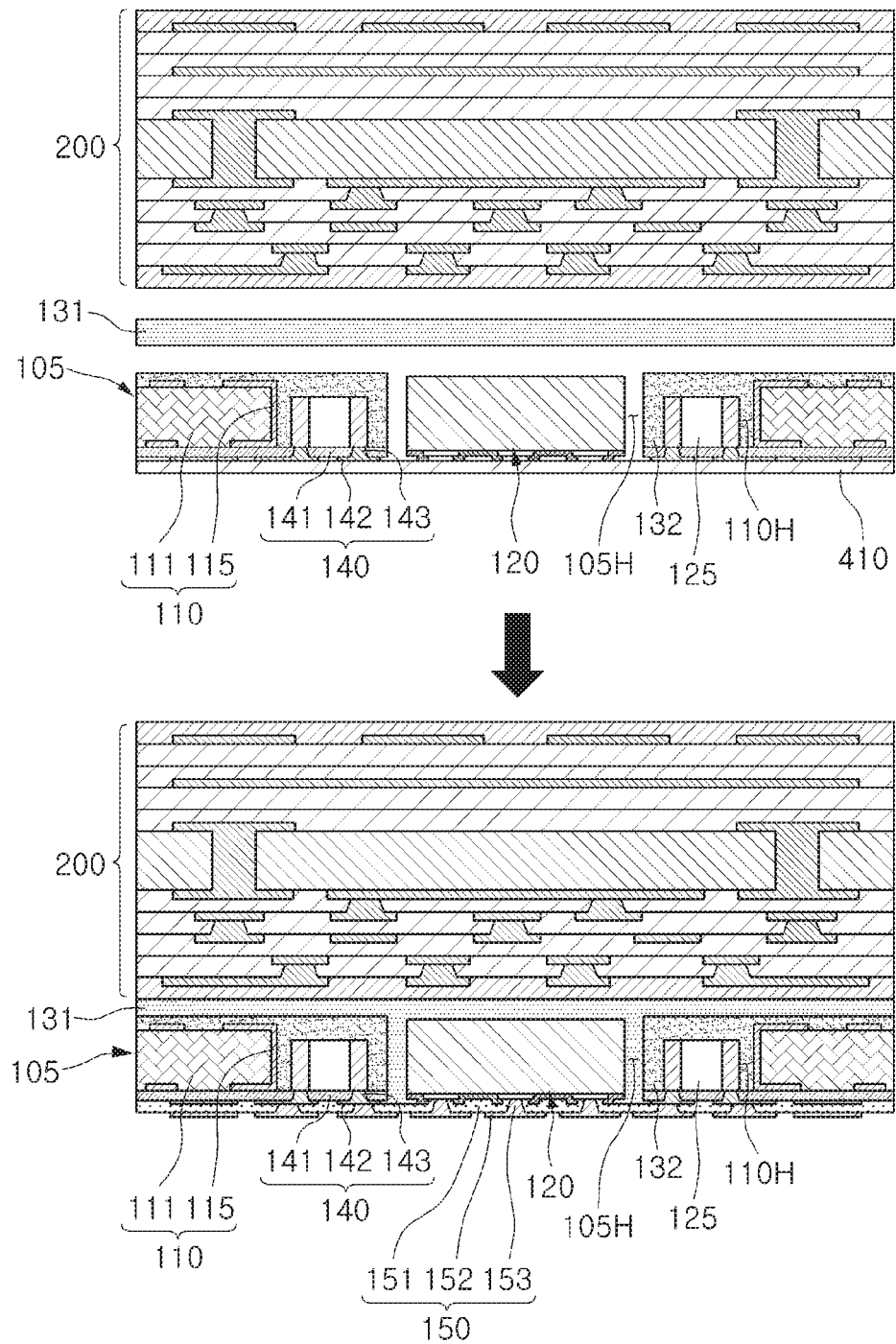
FIG. 11 and FIG. 12 are process flowcharts schematically illustrating an example of a manufacturing process of the semiconductor package of FIG. 9.
Figure 12:
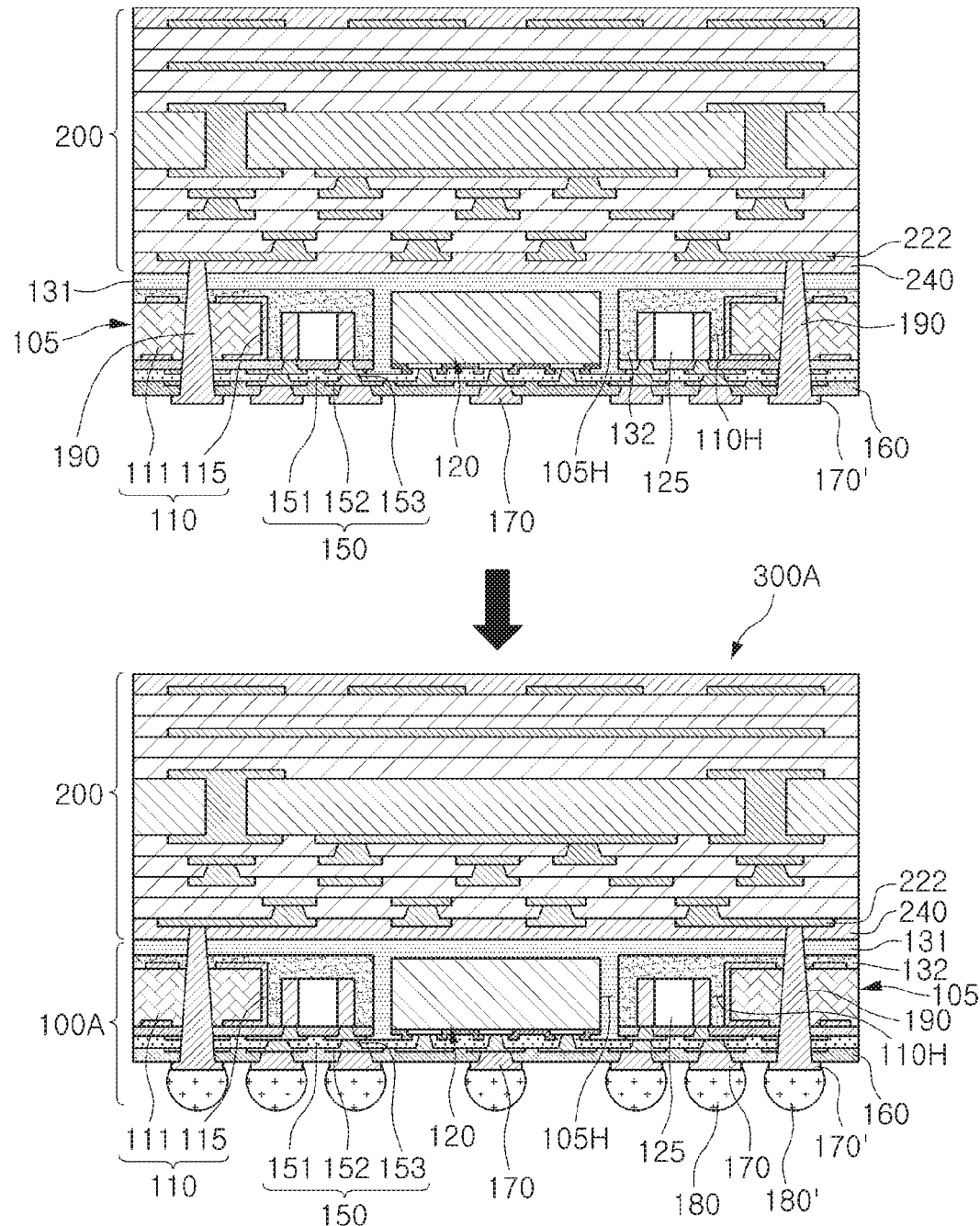

FIG. 11 and FIG. 12 are process flow charts schematically illustrating an example of a manufacturing process of the semiconductor package of FIG. 9.

Referring to FIG. 11, first, an antenna substrate 200 is prepared. The antenna substrate 200 may be prepared by repeating, according to necessity, a plating process and a build-up process in both directions with respect to a copper clad laminate (CCL) or the like. Also, a core structure 105 is prepared. The core structure 105 may be prepared by forming a frame 110 with a CCL or the like, forming a second through portion 110H in the frame 110, disposing a passive component 125 in the second through portion 110H, encapsulating the passive component 125 with a second encapsulant 132, forming a wiring member 140 therebelow, and forming a first through portion 105H penetrating the structure thus formed. Subsequently, by using a tape 410, a semiconductor chip 120 is disposed in a face-down fashion in the first through portion 105H of the core structure 105 and encapsulated with a first encapsulant 131. Next, by using the antenna substrate 200 as a carrier, a connection structure 150 is formed in an area from which the tape 410 is removed.

Referring to FIG. 12, still using the antenna substrate 200 as a carrier, a passivation layer 160 is formed below the connection structure 150. Next, an opening penetrating the passivation layer 160 is formed. When forming the opening, a redistribution layer 152 may be used as a stopper layer. Also, a via hole is formed for a through via which penetrates the passivation layer 160, the connection structure 150, the core structure 105, the first encapsulant 131, and a first cover layer 240. When forming the via hole, a lowermost wiring layer 222 may be used as a stopper layer. The opening and the via hole may be formed using a laser drill or the like. Subsequently, the through via 190 and the first and second under bump metals 170 and 170' are formed by a plating process. Next, still using the antenna substrate 200 as a carrier, if necessary, first and second electrical connection metals 180 and 180' connected to the first and second under bump metals 170 and 170', respectively, are formed below the passivation layer 160. After a reflow process, a semiconductor package 300A according to the example embodiment described above can be produced.

Figure 13:
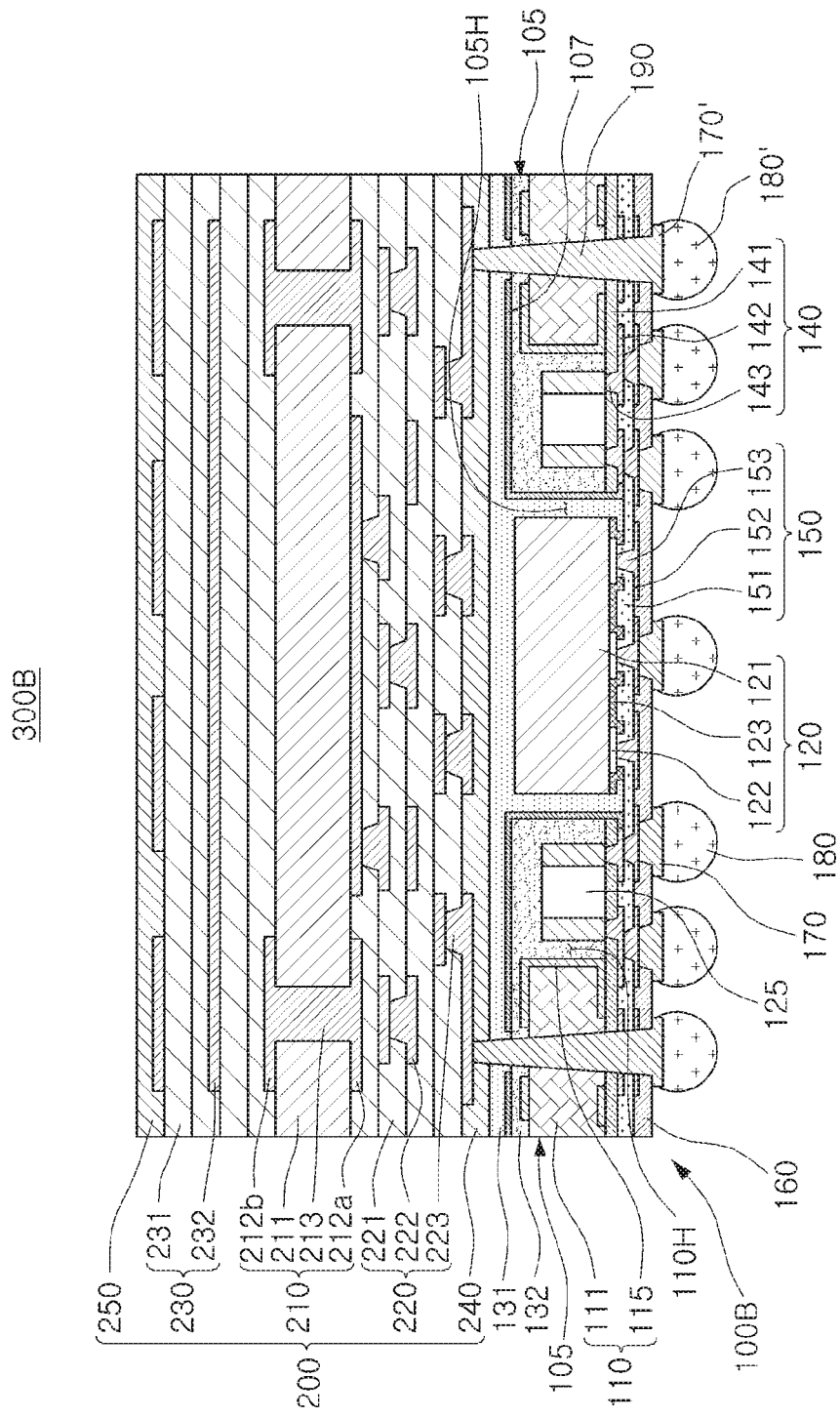
FIG. 13 is a cross-sectional view schematically illustrating a semiconductor package according to another example embodiment.

FIG. 13 is a cross-sectional view schematically illustrating another example embodiment of a semiconductor package.

Referring to the drawings, in a semiconductor package 300B according to another example embodiment, a core structure 105 of a semiconductor substrate 100B further includes a second metal layer 107 disposed on an inner wall of the first through portion 105H, as compared to the semiconductor package 300A described above. Through the above configuration, electromagnetic interference between the semiconductor chip 120 and the passive component 125 can be effectively shielded. In addition, heat dissipation effects can be further improved. The second metal layer 107 may be disposed on the entire inner wall of the first through portion 105H, and if necessary, may extend onto an upper surface of the second encapsulant 132. Also, the second metal layer 107 may extend onto a lower surface of the wiring member 140. The second metal layer 107 may be formed using a metal material such as copper (Cu), aluminum (Al), silver (Ag), tin (Sn), gold (Au), nickel (Ni), lead (Pb), titanium (Ti), and an alloy thereof. The second metal layer 107 may be formed using a plating process known in the art, and may include a seed layer and a plating layer. The second metal layer 107 may be used as a ground plane, if necessary, and in this case, through the through via 190, may be electrically connected to a ground pattern of the wiring layer 142 and/or a ground pattern of the redistribution layer 152. Other components are substantially identical to the components described with reference to the semiconductor package 300A, and therefore, detailed descriptions thereof will not be repeated.

According to example embodiments disclosed herein, there may be provided a semiconductor package which can be made smaller and thinner by being integrated with an antenna substrate, and can enable process warpage control while effectively blocking electromagnetic interference (EMI).

The terms "lower side," "lower portion," "lower surface," and the like, are used herein to refer to a downward direction in relation to cross sections of the drawings, while the terms "upper side," "upper portion," "upper surface," and the like, are used herein to refer to an opposite direction to the downward direction. However, these directions are defined for convenience of description and the claims are not particularly limited by the directions defined as described above, and concepts of upper and lower portions may be exchanged with each other.

Throughout the specification, a statement that an element is "connected to" or "coupled to" another element, it includes a case in which the element is indirectly connected or coupled to the other element through an adhesive layer or the like, as well as a case in which the element is directly connected or coupled to the other element. Also, when an element is "electrically connected" to another element, the element may or may not be in physical connection with the other element. Also, the terms "first," "second," and any variation thereof used herein, do not denote any order or importance of the elements, but are used for the purpose of distinguishing one element from another. For example, a first element could be termed as a second element, and similarly, a second element could be termed as a first element, without departing from the scope of the present disclosure.

The term "an example embodiment" used herein does not refer to the same example embodiment and is provided to emphasize a particular feature of characteristic different from that of another example embodiment. However, example embodiments described herein can be implemented by being combined in whole or in part with one another. For example, For example, one element described in a particular example embodiment, even if it is not described in another example embodiment, may be understood as a description related to another example embodiment unless an opposite or contradictory description is provided therein.

Terms used herein are used only to illustrate example embodiments rather than limiting the scope of the present disclosure. Furthermore, the use of the singular includes the plural unless specifically stated otherwise.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a connection structure having a first surface and a second surface opposing the first surface, and including one or more redistribution layers;
a core structure disposed on the first surface of the connection structure;
a semiconductor chip disposed on the first surface of the connection structure, and including connection pads electrically connected to the one or more redistribution layers of the connection structure;
a first encapsulant disposed on the first surface of the connection structure and covering at least a portion of each of the core structure and the semiconductor chip;
an antenna substrate disposed on the first encapsulant and including one or more wiring layers, at least a portion of the one or more wiring layers including an antenna pattern; and
a through via penetrating at least a portion of each of the connection structure, the core structure, the first encapsulant, and the antenna substrate,
wherein the core structure includes a wiring member disposed on the connection structure and including one or more wiring layers electrically connected to the one or more redistribution layers of the connection structure, a frame disposed on the wiring member, one or more passive components disposed on the wiring member and electrically connected to the one or more wiring layers of the wiring member, and a second encapsulant disposed on the wiring member and covering at least a portion of the frame and the one or more passive components,
wherein the core structure further includes a first through portion in which the semiconductor chip is disposed, and the first encapsulant fills at least portions of the first through portion, and
wherein the frame includes a second through portion in which the one or more passive components is disposed, and the second encapsulant fills at least portions of the second through portion.

2. The semiconductor package of claim 1, wherein the antenna substrate is in physical contact with an upper surface of the first encapsulant.

3. The semiconductor package of claim 1, wherein a surface of the semiconductor chip on which the connection pads are disposed faces the first surface of the connection structure and is in contact with the connection structure, and the surface of the semiconductor chip in contact with the connection structure has a step with respect to a surface of the one or more passive components in contact with the wiring member.

4. The semiconductor package of claim 1, wherein the first through portion has a greater depth than a depth of the second through portion, and when viewed on a plane, the first through portion is disposed within the second through portion.

5. The semiconductor package of claim 1, wherein the core structure further includes a first metal layer disposed on an inner wall of the second through portion and extending onto an upper surface and a lower surface of the frame.

6. The semiconductor package of claim 1, wherein the core structure further includes a second metal layer disposed on an inner wall of the first through portion and extending onto an upper surface of the second encapsulant.

7. The semiconductor package of claim 1, further comprising:
a passivation layer disposed on the second surface of the connection structure and having an opening exposing at least portions of the one or more redistribution layers;
a first under bump metal disposed in the opening of the passivation layer and on a lower surface of the passivation layer, and electrically connected to the exposed portions of the one or more redistribution layers; and
a first electrical connection metal disposed on the lower surface of the passivation layer and electrically connected to the exposed portions of the one or more redistribution layers through the first under bump metal.

8. The semiconductor package of claim 7, further comprising:
a second under bump metal disposed on the lower surface of the passivation layer; and
a second electrical connection metal disposed on the lower surface of the passivation layer and electrically connected to the second under bump metal,
wherein the through via further penetrates the passivation layer, thereby electrically connecting the one or more wiring layers of the antenna substrate and the second under bump metal to each other.

9. The semiconductor package of claim 1, wherein the through via penetrates at least portions of the one or more redistribution layers of the connection structure, and
the penetrated portions of the one or more redistribution layers of the connection structure are electrically connected to the through via in the penetrated portions thereof.

10. The semiconductor package of claim 1, wherein the antenna substrate includes:
a core layer,
a first wiring layer and a second wiring layer disposed on a lower surface of the core layer and an upper surface of the core layer, respectively,
a plurality of first build-up insulating layers disposed on the lower surface of the core layer,
a plurality of third wiring layers, each disposed on a lower surface of each of the plurality of first build-up insulating layers,
a plurality of second build-up insulating layers disposed on the upper surface of the core layer,
a plurality of fourth wiring layers, each disposed on an upper surface of each of the plurality of second build-up insulating layers,
a first cover layer disposed on a lower surface of a lowermost first build-up insulating layer among the plurality of first build-up insulating layers, and covering at least portions of a lowermost third wiring layer among the plurality of third wiring layers, and
a second cover layer disposed on the upper surface of an uppermost second build-up insulating layer among the plurality of second build-up insulating layers, and covering at least portions of an uppermost fourth wiring layer among the plurality of fourth wiring layers, and
the core layer is thicker than each of the plurality of first build-up insulating layers and the plurality of second build-up insulating layers.

11. The semiconductor package of claim 10, wherein the through via penetrates the first cover layer and is electrically connected to the lowermost third wiring layer among the plurality of third wiring layers.

12. The semiconductor package of claim 10, wherein the uppermost fourth wiring layer among the plurality of fourth wiring layers includes a first antenna pattern, the second wiring layer includes a second antenna pattern disposed on a lower level than the first antenna pattern, at least one of the first wiring layer and the plurality of third wiring layers includes a feeding pattern electrically connected to the second antenna pattern, and at least one of the plurality of fourth wiring layers, the first wiring layer, the second wiring layer, and the plurality of third wiring layers includes a ground pattern.

13. The semiconductor package of claim 1, wherein the through via is in direct contact with a lowermost one of the one or more wiring layers of the antenna substrate.

14. The semiconductor package of claim 1, wherein the through via is tapered in a direction from the connection structure to the antenna substrate.

15. The semiconductor package of claim 1, wherein the frame includes an insulating layer and a metal layer on the insulating layer.

16. The semiconductor package of claim 1, wherein a surface of the second encapsulant is covered with the first encapsulant, the surface of the second encapsulant and the first surface of the connection structure facing in a same direction.

* * * * *